(12) United States Patent
Choi et al.

(10) Patent No.: US 11,335,738 B2
(45) Date of Patent: May 17, 2022

(54) DISPLAY DEVICE AND METHOD OF MANUFACTURING THE SAME

(71) Applicant: Samsung Display Co., Ltd., Yongin-si (KR)

(72) Inventors: Junho Choi, Yongin-si (KR); Chungi You, Yongin-si (KR); Minchang Kim, Yongin-si (KR); Taeik Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 16/923,657

(22) Filed: Jul. 8, 2020

(65) Prior Publication Data

US 2021/0111367 A1 Apr. 15, 2021

(30) Foreign Application Priority Data

Oct. 15, 2019 (KR) .......................... 10-2019-0127862

(51) Int. Cl.
*H01L 51/52* (2006.01)
*H01L 51/56* (2006.01)
*H01L 27/32* (2006.01)

(52) U.S. Cl.
CPC ........ *H01L 27/3225* (2013.01); *H01L 27/323* (2013.01); *H01L 27/3234* (2013.01); *H01L 51/5246* (2013.01); *H01L 51/56* (2013.01); *H01L 2251/303* (2013.01); *H05K 2201/09036* (2013.01); *H05K 2201/09072* (2013.01)

(58) Field of Classification Search
CPC .. H01L 27/1218; H01L 27/3225–3234; H05K 2201/09036; H05K 2201/09072; B32B 3/26–30
See application file for complete search history.

(56) References Cited

U.S. PATENT DOCUMENTS

| 7,808,540 | B2 | 10/2010 | Cok |
| 8,659,218 | B2 | 2/2014 | Hwang et al. |
| 8,731,618 | B2 | 5/2014 | Jarvis et al. |
| 2018/0159075 | A1* | 6/2018 | Kim ................. H01L 29/78603 |

(Continued)

FOREIGN PATENT DOCUMENTS

| CN | 104765192 A | * | 7/2015 | .......... G02F 1/1333 |
| CN | 205983294 U | | 2/2017 | |
| KR | 10-1156435 B1 | | 6/2012 | |

OTHER PUBLICATIONS

Machine translation, Xia, Chinese Pat. Pub. No. CN 205983294U, translation date: Oct. 21, 2021, Espacenet, all pages. (Year: 2021).*

(Continued)

*Primary Examiner* — Victoria K. Hall
(74) *Attorney, Agent, or Firm* — Lewis Roca Rothgerber Christie LLP

(57) ABSTRACT

A display device includes: a lower substrate including a first area, and a second area surrounding the first area; a display layer including a plurality of display elements at the second area, and having a first hole corresponding to the first area; and an upper substrate covering the display layer. The upper substrate includes a lower surface facing the lower substrate, and the lower surface of the upper substrate has a first groove corresponding to the first area.

20 Claims, 11 Drawing Sheets

(56) References Cited

U.S. PATENT DOCUMENTS

| | | | | |
|---|---|---|---|---|
| 2020/0343481 A1* | 10/2020 | Lee | ................ | G06F 1/1637 |
| 2021/0126060 A1* | 4/2021 | Koo | ................ | H01L 51/5246 |
| 2021/0200020 A1* | 7/2021 | Kim | ................ | H01L 27/3234 |
| 2021/0200366 A1* | 7/2021 | Bok | ................ | H01L 27/3227 |
| 2021/0320163 A1* | 10/2021 | Bang | ................ | H01L 27/3248 |

OTHER PUBLICATIONS

Machine translation, Liu, Chinese Pat. Pub. No. CN 104765192A, translation date: Dec. 18, 2021, Espacenet, all pages. (Year: 2021).*

\* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2019-0127862, filed on Oct. 15, 2019, in the Korean Intellectual Property Office, the entire disclosure of which is incorporated by reference herein.

BACKGROUND

1. Field

Aspects of one or more example embodiments of the present disclosure relate to a display device and a method of manufacturing the display device.

2. Description of Related Art

Use of display devices has become more diversified. Further, as the thickness and weight of display devices have been reduced, a range of use of the display devices has been gradually extended.

The area occupied by a display area for outputting images has been increased, and various functions that may be combined or associated with display devices have been gradually developed.

The above information disclosed in this Background section is for enhancement of understanding of the background of the disclosure, and therefore, it may contain information that does not constitute prior art.

SUMMARY

One or more example embodiments of the present disclosure may be directed to a display device including an area in which a component, for example, such as a camera, a sensor, and/or the like, is arranged inside (e.g., within) a display area, and the area may have a relatively high light transmittance corresponding to an arrangement position of the component for a smooth operation (e.g., an intended, a desired, an enhanced, or an improved operation) of the component.

According to one or more example embodiments of the present disclosure, a display device includes: a lower substrate including a first area, and a second area surrounding the first area; a display layer including a plurality of display elements at the second area, and having a first hole corresponding to the first area; and an upper substrate covering the display layer. The upper substrate includes a lower surface facing the lower substrate, and the lower surface of the upper substrate has a first groove corresponding to the first area.

In an example embodiment, a space may be defined by the first hole and the first groove at the first area between the lower substrate and the upper substrate, and may have a height of about 10 μm to about 50 μm.

In an example embodiment, a taper angle at one end of the first groove may be about 5° to about 60°.

In an example embodiment, a depth of the first groove may be about 5 μm to about 45 μm.

In an example embodiment, the plurality of display elements may include a first display element and a second display element that may be adjacent to each other, and the first display element and the second display element may be spaced from each other with respect to the first hole.

In an example embodiment, each of the plurality of display elements may include a pixel electrode, an opposite electrode, and an intermediate layer between the pixel electrode and the opposite electrode, and the opposite electrode may be integrally provided as a single body and may have a hole corresponding to the first area.

In an example embodiment, the display device may further include an input sensing layer on the upper substrate and having a second hole corresponding to the first area.

In an example embodiment, the lower substrate may include an upper surface facing the upper substrate, and the upper surface of the lower substrate may have a second groove corresponding to the first area.

In an example embodiment, the second groove may be formed through an etching process before forming the display layer.

In an example embodiment, a space may be defined by the first groove, the first hole, and the second groove at the first area between the lower substrate and the upper substrate, and may have a height of about 10 μm to about 50 μm.

In an example embodiment, each of the lower substrate and the upper substrate may include a glass material including at least one from among silicon oxide ($SiO_2$), magnesium oxide (MgO), calcium oxide (CaO), and zinc oxide (ZnO).

According to one or more example embodiments of the present disclosure, a method of manufacturing a display device including a first area and a second area surrounding the first area, includes: forming a groove corresponding to the first area at at least one of a lower substrate and an upper substrate; forming a display layer on the lower substrate, the display layer including a plurality of display elements corresponding to the second area, and having a first hole corresponding to the first area; arranging the upper substrate on the lower substrate with the display layer therebetween; and bonding an upper surface of the lower substrate to a lower surface of the upper substrate by using a sealant.

In an example embodiment, the forming of the groove may include: attaching an acid-resistant film to the lower surface of the upper substrate; removing a portion of the acid-resistant film corresponding to the first area and attached to the upper substrate; etching, the upper substrate to which the acid-resistant film is attached by using an etchant; and removing remaining portions of the acid-resistant film attached to the upper substrate.

In an example embodiment, the forming of the groove may include forming the groove to have a taper angle of about 5° to about 60°.

In an example embodiment, the forming of the groove may include forming the groove to have a depth of about 5 μm to about 45 μm.

In an example embodiment, the groove and the first hole may overlap with each other to form a space having a height of about 10 μm to about 50 μm.

In an example embodiment, the etchant may include at least one from among sulfuric acid ($H_2SO_4$), hydrofluoric acid (HF), and hydrochloric acid (HCl).

In an example embodiment, the sealant may be between the lower substrate and the upper substrate, and may surround the plurality of display elements.

According to one or more example embodiments of the present disclosure, a display device includes: a substrate including a first area, and a second area surrounding the first area; and an input sensing layer on a first surface of the substrate, and having a hole corresponding to the first area.

The substrate has a groove corresponding to the first area at a second surface opposite the first surface.

In an example embodiment, the groove may have a depth of about 5 µm to about 45 µm.

According to one or more embodiments, a display device may include: a lower substrate including a first area and a second area surrounding (e.g., around a periphery of) the first area; a display layer including a plurality of display elements arranged at (e.g., in or on) the second area, and a first hole corresponding to the first area; an upper substrate covering the display layer; and a cavity defined by a space between the lower substrate and the upper substrate at (e.g., in or on) the first area. The cavity may have a height of about 10 µm to about 50 µm.

In an example embodiment, at least one of the upper substrate or the lower substrate may include a groove overlapping with the first hole at a location corresponding to the first area, and the cavity may be defined by the groove and the first hole.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
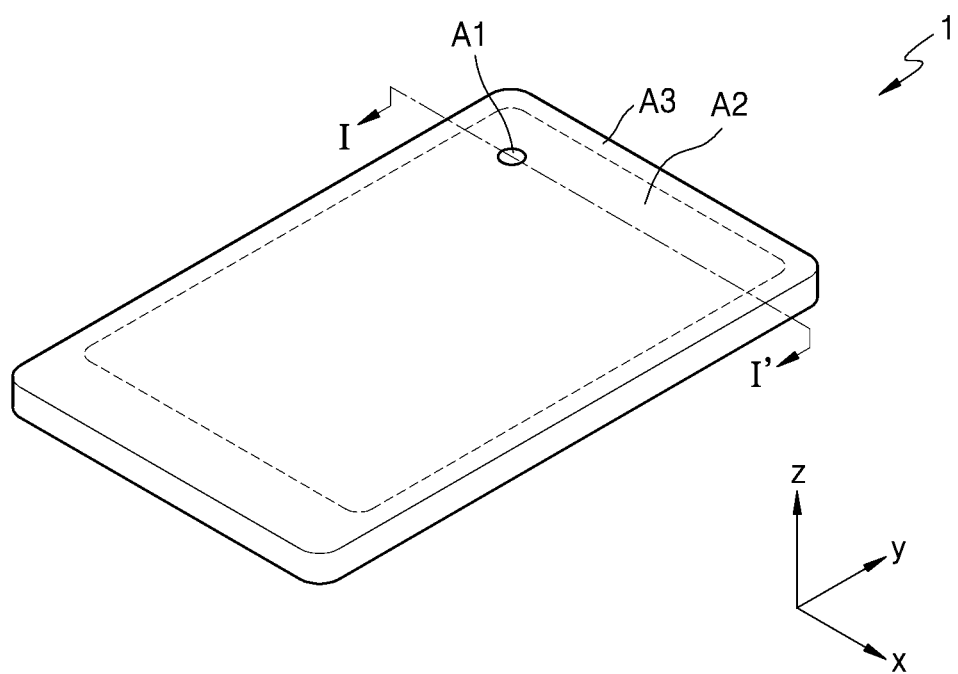
FIG. 1 is a schematic perspective view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a particular embodiment may be implemented differently, a specific process order may be different from a described one. For example, two processes that are consecutively described may be performed at the same or substantially at the same time, or may be performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, or component, for example, such as a film, an area, a plate, and/or the like, is referred to as being "on," "connected to," or "coupled to" another element, layer, or component, it can be directly on, connected to, or coupled to the other element, layer, or component, or one or more intervening elements, layers, or components may be present. In addition, it will also be understood that when an element, layer, or component is referred to as being "between" two elements, layers, or components, it can be the only element, layer, or component between the two elements, layers, or components, or one or more intervening elements, layers, or components may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, "A and/or B" refers to A or B, or A and B. Expressions such as "at least one of," when preceding a list of elements, modify the entire list of elements and do not modify the individual elements of the list. For example, the expression "at least one of a, b, and c" may indicate only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display device 1 according to an embodiment.

Referring to FIG. 1, the display device 1 may include a first area A1, a second area A2, and a third area A3.

The first area A1 may include an area having a relatively high light transmittance corresponding to a component provided within (e.g., provided inside of) the display device 1. For example, the first area A1 may be understood as a transmission area through which light output from the component towards the outside is transmitted, and/or through which light incident from the outside towards the component is transmitted. For example, the first area A1 may be referred to as a component area, a sensor area, or an opening area.

The second area A2 may be defined as an area at (e.g., in or on) which a plurality of pixels are arranged. The display device 1 may provide desired image information by using light emitted from the plurality of pixels arranged at (e.g., in or on) the second area A2. For example, the second area A2 may be referred to as a display area.

The second area A2 may be arranged to at least partially surround (e.g., around a periphery of) the first area A1. In an embodiment, the second area A2 may entirely surround (e.g., around the periphery of) the first area A1 as shown in FIG. 1.

The second area A2 may be located within (e.g., inside) the third area A3. In other words, the third area A3 may surround (e.g., around a periphery of) the second area A2. For example, the first area A1 may be surrounded (e.g., around a periphery thereof) by the second area A2, and the second area A2 may be surrounded (e.g., around a periphery thereof) by the third area A3.

The third area A3 may include an area at (e.g., in or on) which a circuit configuration may be positioned for providing an electrical signal to the pixels arranged at (e.g., in or on) the second area A2. In FIG. 1, the first area A1 and the third area A3 may correspond to a non-display area at (e.g., in or on) which pixels are not arranged.

Although FIG. 1 illustrates that the first area A1 is arranged at (e.g., in or on) one side (e.g., an upper left side) of the second area A2, the present disclosure is not limited thereto, and the location and/or number of the first area A1 may be variously modified. For example, the first area A1 may be arranged at (e.g., in or on) an upper central portion of a plane (e.g., an x-y plane) of the second area A2, and/or the first area A1 may be provided as a plurality of first areas A1 at (e.g., in, on, inside, or within) the second area A2. Further, while FIG. 1 illustrates that the second area A2 has a rectangular or substantially rectangular shape (e.g., in a plan view), the present disclosure is not limited thereto. For example, the second area A2 may have any other suitable shape (e.g., in a plan view), such as a circle, a polygon (e.g., such as a triangle, a pentagon, and/or the like), an ellipse, and/or the like.

Hereinafter, for convenience of description, an organic light-emitting display device may be described as an example of the display device 1 according to an embodiment, but the present disclosure is not limited thereto. For example, in other embodiments, the display device 1 may include (e.g., may be) various suitable kinds of display devices, for example, such as an inorganic light-emitting display (e.g., an inorganic EL display) device, a quantum dot light-emitting display device, and/or the like. For example, an emission layer of a display element provided in the display device 1 may include an organic material, an inorganic material, quantum dots, an organic material and quantum dots, an inorganic material and quantum dots, and/or the like.

The display device 1 may be included in (or may be) various kinds of electronic devices, for example, such as mobile phones, laptops, smartwatches, and/or the like.

Figure 2:
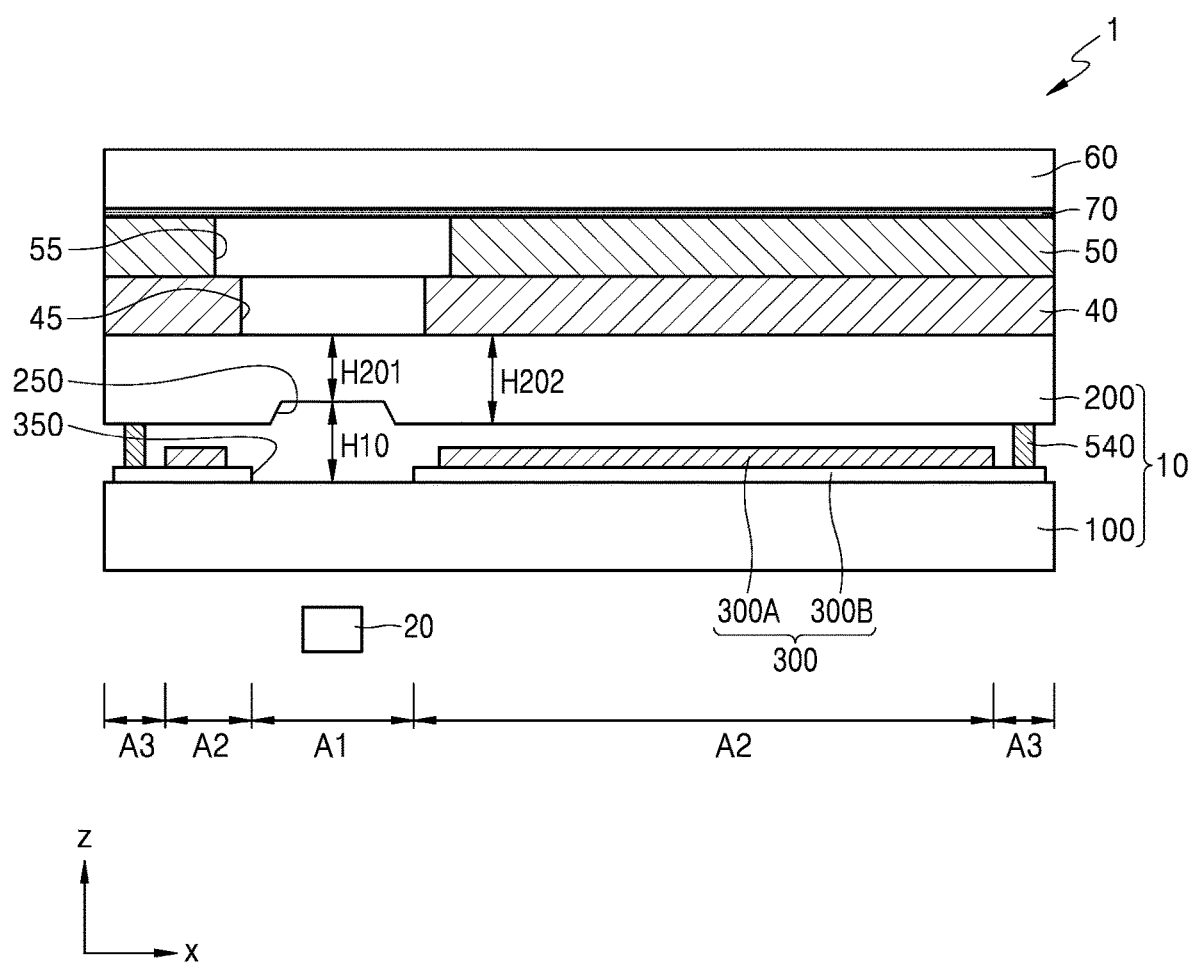
FIG. 2 is a cross-sectional view of a display device according to an embodiment.

FIG. 2 is a cross-sectional view of the display device 1 according to an embodiment. For example, FIG. 2 may correspond to a cross-section of the display device 1 taken along the line I-I' of FIG. 1.

Referring to FIG. 2, the display device 1 may include a display panel 10, an input sensing layer 40 and/or an optical functional layer 50 arranged on the display panel 10, and a window 60 covering the display panel 10 and the input sensing layer 40 and/or the optical functional layer 50.

The window 60 may be connected to (e.g., attached to or combined with) an element thereunder, for example, such as the optical functional layer 50 (or the input sensing layer 40), via an adhesive layer 70, for example, such as an optical clear adhesive (OCA).

The display device 1 may further include a component 20 under the display panel 10.

The component 20 may include an electronic element that uses light. For example, the component 20 may include a device that uses light in various wavelength bands, such as visible light, infrared light, ultraviolet light, and/or the like. For example, the component 20 may include a camera module (e.g., a camera or a camera device) for obtaining image information by using light from the outside (e.g., by using external light).

The display panel 10 may include a lower substrate 100, an upper substrate 200 on (e.g., facing) the lower substrate 100, and a display layer 300 therebetween. The display panel 10 may further include a sealant 540 covering a side surface of the display layer 300 between the lower substrate 100 and the upper substrate 200. The sealant 540 may be positioned to surround (e.g., around a periphery of) a plurality of display elements of the display layer 300 to protect the plurality of display elements, and may connect (e.g., may bond) the lower substrate 100 to the upper substrate 200.

Each of the lower substrate 100 and the upper substrate 200 may include at least one from among silicon oxide ($SiO_2$), magnesium oxide (MgO), calcium oxide (CaO), and zinc oxide (ZnO). For example, in an embodiment, each of the lower substrate 100 and the upper substrate 200 may include a glass material using $SiO_2$ as a main component.

According to another example, each of the lower substrate 100 and the upper substrate 200 may include a polymer resin. For example, in an embodiment, each of the lower substrate 100 and the upper substrate 200 may have a multilayered structure including a layer including a polymer resin, and an inorganic layer.

The display layer 300 may be located between the lower substrate 100 and the upper substrate 200.

The display layer 300 may include a plurality of pixels. The display layer 300 may include a display element layer 300A including display elements provided for each pixel, and a pixel circuit layer 300B including pixel circuits electrically connected to each of the display elements and insulating layers therebetween. For example, each of the display elements of the display element layer 300A may include an organic light-emitting diode (OLED). Each of the display elements may be located at (e.g., in or on) the second area A2.

The display layer 300 may include a first hole 350 at a position corresponding to the first area A1. For example, the component 20 located under the lower substrate 100 to correspond to the first area A1 may receive light that passing through (e.g., transmits through) the first hole 350, and/or may emit light to the outside through the first hole 350. For example, the first hole 350 may define the first area A1. As an example, in the display device 1, the first area A1 may correspond to an area at (e.g., in or on) which the first hole 350 of the display layer 300 is formed.

According to an embodiment, the upper substrate 200 may include a first groove 250 corresponding to the first area A1. For example, the first groove 250 may be located on a lower surface of the upper substrate 200, which may be a surface of the upper substrate 200 facing the lower substrate 100. The first groove 250 may be provided to have a concave shape towards an inside (e.g., extending towards an upper surface) of the upper substrate 200 at a position corresponding to the first area A1 on the lower surface of the upper substrate 200. The upper substrate 200 may have a thickness H201 (e.g., in a Z-axis direction) at (e.g., in) the first area A1, which may be smaller than (e.g., less than) a thickness (e.g., in the Z-axis direction) of the upper substrate 200 at (e.g., in) another area, for example, a thickness H202 at (e.g., in) the second area A2.

Referring to FIG. 2, the display panel 10 may include a cavity formed by a space between the lower substrate 100 and the upper substrate 200 at (e.g., in or on) the first area A1. The cavity may refer to an air gap formed between the lower substrate 100 and the upper substrate 200. The cavity may correspond to a space defined by the first hole 350 of the display layer 300 and the first groove 250 of the upper substrate 200. In other words, in FIG. 2, the cavity may overlap with the first hole 350 and the first groove 250.

The first groove 250 of the upper substrate 200 may have a depth (e.g., in the Z-axis direction) of about 5 micrometers (μm) to about 45 μm. Also, the first hole 350 of the display layer 300 may have a height (e.g., in the Z-axis direction) of about 5 μm. In this case, the cavity overlapping with the first groove 250 and the first hole 350 may have a height H10 (e.g., in the Z-axis direction) of about 10 μm to about 50 μm.

According to an embodiment, in the display panel 10, the cavity formed at (e.g., in or on) the first area A1 corresponding to the position of the component 20 may have a height of about 10 μm to about 50 μm, and thus, a variation (e.g., a deviation) in light transmittance for each wavelength band originating from (e.g., resulting from) a height variation (e.g., a height deviation) of the cavity may be reduced or minimized.

The input sensing layer 40 may be located on the display panel 10. For example, the input sensing layer 40 may be located on the upper substrate 200.

The input sensing layer 40 may obtain coordinate information according to an external input, for example, a touch event. The input sensing layer 40 may include a sensing electrode and/or a touch electrode, and trace lines connected to the sensing electrode and/or the touch electrode. The input sensing layer 40 may sense an external input (e.g., a touch event) by using a mutual-capacitance (e.g., a mutual-cap) method or a self-capacitance (e.g., a self-cap) method.

In an embodiment, the input sensing layer 40 may be formed separately from the display panel 10, and may be connected to (e.g., attached to or bonded to) the display panel 10 through an adhesive layer, for example, such as an optical clear adhesive. In another embodiment, the input sensing layer 40 may be formed on (e.g., directly on) the display panel 10, for example, on the upper substrate 200. For example, the input sensing layer 40 may be formed (e.g., may be continuously formed) on the display panel 10 after the process of forming the display panel 10. In this case, the input sensing layer 40 may be understood as a part of the display panel 10, and the adhesive layer may be omitted from (e.g., may not be) between the input sensing layer 40 and the display panel 10. While FIG. 2 illustrates that the input sensing layer 40 may be between the display panel 10 and the optical functional layer 50, the present disclosure is not limited thereto, and in another embodiment, the input sensing layer 40 may be located on (e.g., an opposite side of) the optical functional layer 50. In this case, for example, the optical functional layer 50 may be between the display panel 10 and the input sensing layer 40.

The optical functional layer 50 may include a reflection prevention layer. The reflection prevention layer may reduce the reflectance of light incident from the outside towards the display panel 10 through the window 60. The reflection prevention layer may include a phase retarder and a polarizer.

The phase retarder may be a film type or a liquid crystal coating type, and may include a λ/2 (e.g., a half-wave) phase retarder and/or a λ/4 (e.g., a quarter-wave) phase retarder. The polarizer may be a film type or a liquid crystal coating type. The film type may include an elongated synthetic resin film, and the liquid crystal coating type may include liquid crystals arranged in a desired or suitable arrangement. The phase retarder and the polarizer may further include a protection film. For example, the protection film or the phase retarder and the polarizer themselves may be defined as a base layer of the reflection prevention layer. In another embodiment, the reflection prevention layer may include a black matrix and color filters. The color filters may be arranged in consideration of a color of light emitted from each of the pixels of the display panel 10.

In another embodiment, the reflection prevention layer may include a destructive interference structure. The destructive interference structure may include a first reflection layer and a second reflection layer arranged at (e.g., in or on) different layers from each other. A first reflected light and a second reflected light reflected from the first reflection layer and the second reflection layer, respectively, may destructively interfere with each other, and thus, the reflectance of external light may be reduced.

The optical functional layer 50 may include a lens layer. The lens layer may improve light emission efficiency of light emitted from the display panel 10, and/or may reduce a color variation (e.g., a color deviation). The lens layer may include a layer having a concave or convex lens shape, and/or may include a plurality of layers having different refractive indexes from each other. The optical functional layer 50 may include both the reflection prevention layer and the lens layer, or may include any one of the reflection prevention layer or the lens layer as needed or desired.

In an embodiment, the optical functional layer 50 may be formed (e.g., may be continuously formed) after the process of forming the display panel 10 and/or the input sensing layer 40. In this case, a separate adhesive layer may be omitted from (e.g., may not be) between the optical functional layer 50, the display panel 10, and/or the input sensing layer 40.

The input sensing layer 40 and/or the optical functional layer 50 may include holes corresponding to the first area A1. In this regard, in some embodiments, the input sensing layer 40 and the optical functional layer 50 may include a second hole 45 and a third hole 55, respectively, and the second hole 45 and the third hole 55 may overlap with each other, as shown in FIG. 2. For example, the first hole 350 of the display layer 300 and the first groove 250 of the upper substrate 200 may each have a width (e.g., in an X-axis direction) that is greater than that of the component 20, and the second hole 45 and the third hole 55 may each have a width (e.g., in the X-axis direction) that is greater than that of the first hole 350. In an embodiment, the third hole 55 may have a width greater than that of the second hole 45.

In another embodiment, at least one of the input sensing layer 40 and the optical functional layer 50 may not include a hole.

Figure 3:
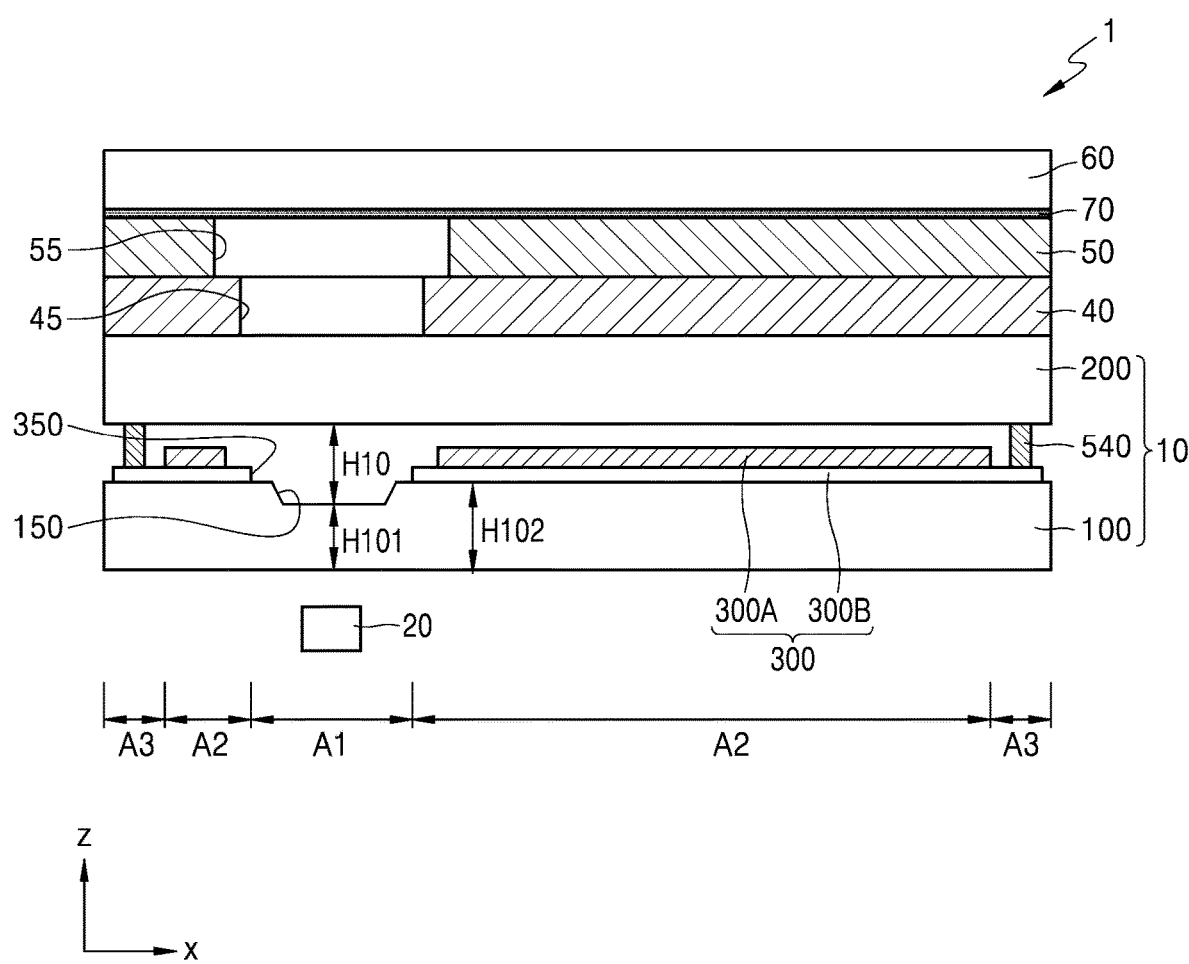
FIG. 3 is a cross-sectional view of a display device according to an embodiment.

FIG. 3 is a cross-sectional view of the display device 1 according to an embodiment.

Referring to FIG. 3, the display panel 10 included in the display device 1 may include the lower substrate 100, the upper substrate 200, and the display layer 300 therebetween.

The display layer 300 may include the first hole 350 corresponding to the first area A1, and the lower substrate 100 may include a second groove 150 corresponding to the first area A1. The second groove 150 may be formed at (e.g., in or on) an upper surface of the lower substrate 100 facing the upper substrate 200. Because the lower substrate 100 includes the second groove 150, the lower substrate 100 may have a thickness H101 (e.g., in the Z-axis direction) at (e.g., in) the first area A1, which may be smaller than (e.g., less than) a thickness of the lower substrate 100 at (e.g., in) another area, for example, a thickness H102 (e.g., in the Z-direction) at (e.g., in or on) the second area A2.

A cavity may be formed between the upper surface of the lower substrate 100 and the lower surface of the upper substrate 200 at (e.g., in or on) the first area A1, as a space formed by the first hole 350 and the second groove 150. In other words, as shown in FIG. 3, the cavity may overlap with the first hole 350 and the second groove 150.

The second groove 150 of the lower substrate 100 may have a depth (e.g., in the Z-axis direction) of about 5 μm to about 45 μm, and the first hole 350 of the display layer 300 may have a depth of about 5 μm. A height H10 (e.g., in the Z-axis direction) of the cavity formed by the second groove 150 and the first hole 350 may be about 10 μm to about 50 μm.

In an embodiment because the lower substrate 100 of the display panel 10 includes the second groove 150 as shown in FIG. 3, the upper substrate 200 of the display panel 10 may not include the first groove 250 as shown in FIG. 2, but the present disclosure is not limited thereto.

For example, in another embodiment, the display panel 10 may include the first groove 250 (e.g., see FIG. 2) at (e.g., in) the upper substrate 200, and the second groove 150 (e.g., see FIG. 3) at (e.g., in) the lower substrate 100. In this case, the cavity formed by the space between the lower substrate 100 and the upper substrate 200 at (e.g., in or on) the first area A1 may overlap with the first groove 250, the first hole 350, and the second groove 150.

The second groove 150 of the lower substrate 100 may be formed through an etching process before arranging the display layer 300.

Because the other elements of the display device 1 shown in FIG. 3 may be the same or substantially the same as those of FIG. 2, redundant description thereof may not be repeated.

Figure 4A:
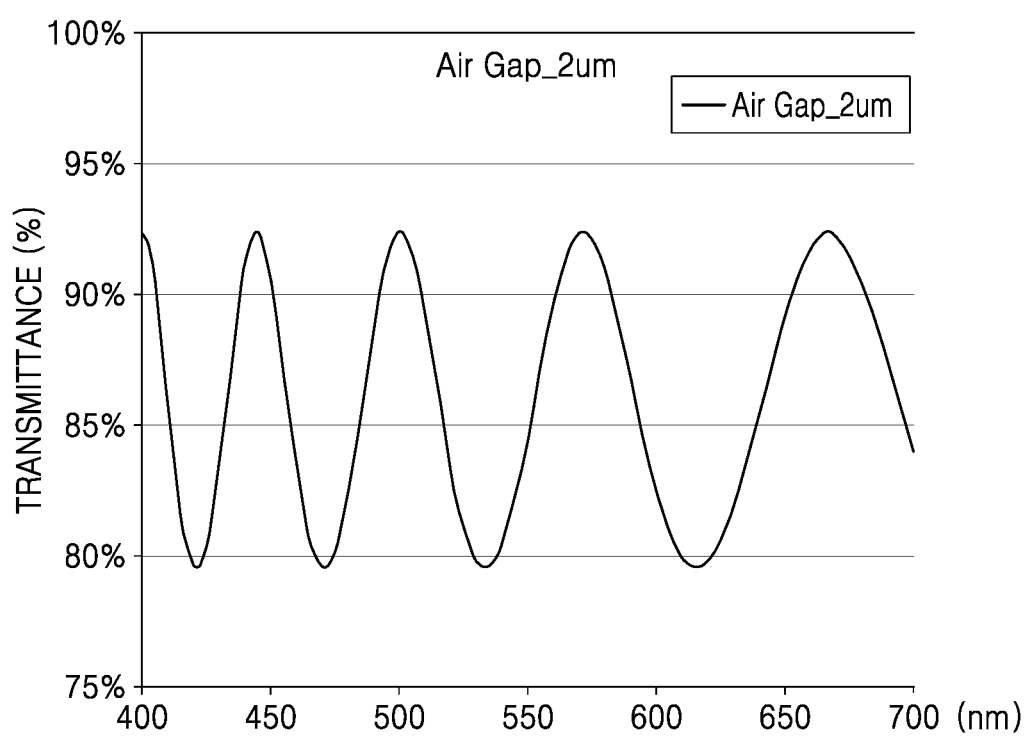
FIGS. 4A-4C are graphs illustrating transmittance characteristics for each wavelength band according to the height of a cavity.
Figure 4B:
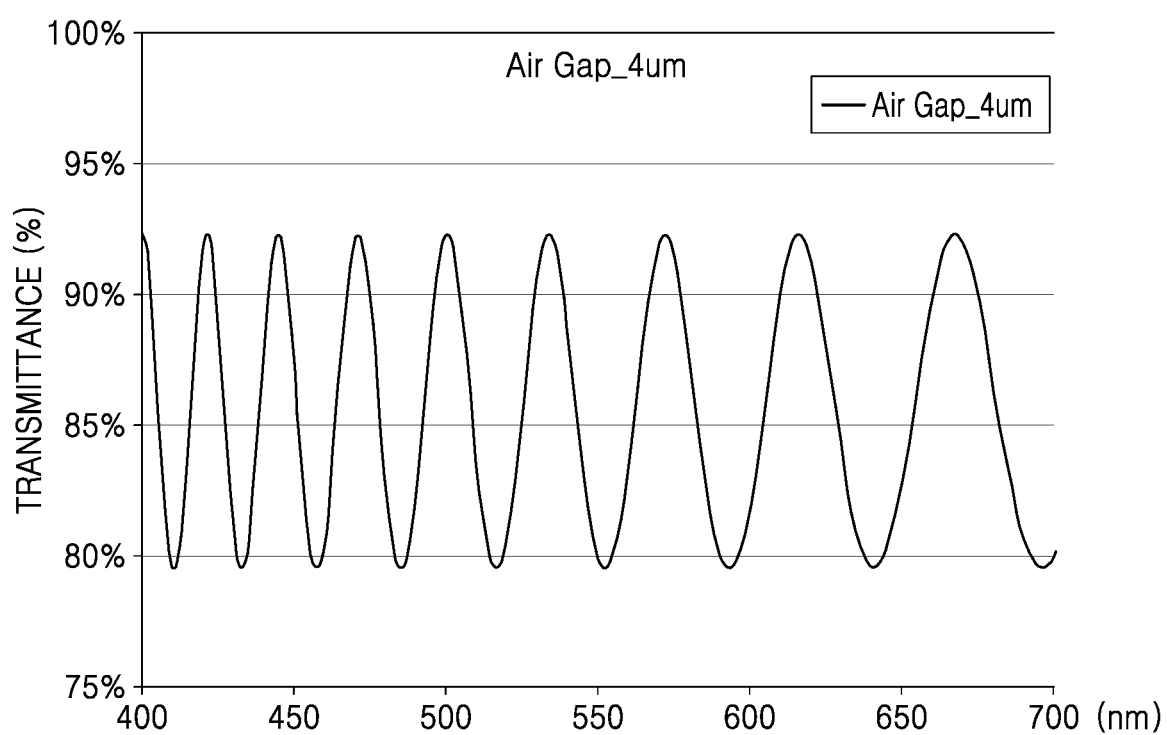
Figure 4C:
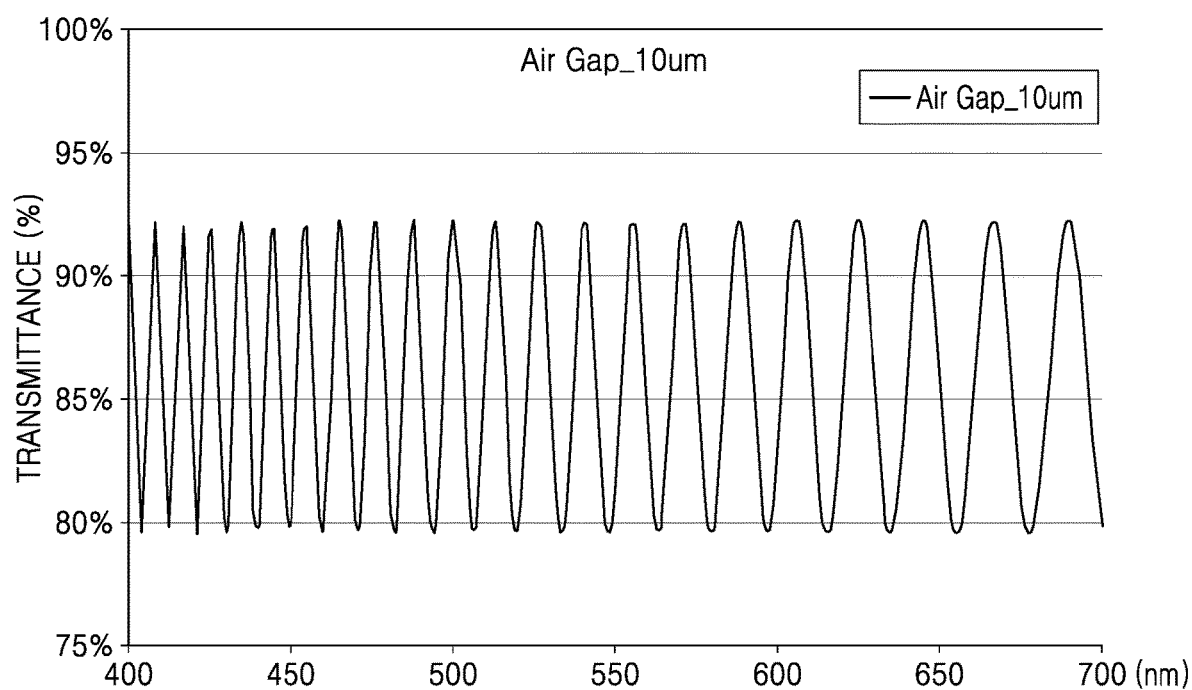

FIGS. 4A through 4C are graphs illustrating transmittance characteristics for each wavelength band according to the height of a cavity.

The cavity may refer to an air gap formed between two substrates of a transparent material. For example, the cavity may refer to an air gap defined by a space between the lower substrate 100 and the upper substrate 200 at (e.g., in or on) the first area A1 as shown in FIG. 2 or FIG. 3. As described with reference to FIG. 2, the display layer 300 of the display device 1 may include the first hole 350, such that the light transmittance may be relatively high at (e.g., in) the first area A1 corresponding to the component 20. A space, for example, such as a cavity, may be defined between the lower substrate 100 and the upper substrate 200 by the first hole 350.

FIGS. 4A, 4B, and 4C are graphs illustrating a transmittance of a visible light wavelength band when the height of the cavity is about 2 μm, when the height of the cavity is about 4 μm, and when the height of the cavity is about 10 μm, respectively.

Referring to FIGS. 4A through 4C, a transmittance value of light passing through an area where the cavity is formed may have a wave shape having a cycle (e.g., a specific cycle) and an amplitude (e.g., a specific amplitude) according to a wavelength band.

As shown in FIGS. 4A through 4C, the transmittance value of the light passing through the area where the cavity is formed may have a relatively shorter cycle as the height of the cavity, for example, the height of the air gap, is increased. In this case, the possibility that a destructive interference is caused between rays of light having different transmittance spectra according to the height distribution of the cavity may be increased. Accordingly, a variation (e.g., a deviation) in the transmittance for each wavelength band with respect to the light passing through the area where the cavity is formed may be reduced.

According to one or more embodiments, the display device 1 includes the cavity, which may be formed at (e.g., in or on) the first area A1 (e.g., see FIG. 2), having the height of about 10 μm to about 50 μm, and thus, distortion of optical characteristics of the component 20 (e.g., see FIG. 2) may be reduced or minimized. For example, the display device 1 may include the first groove 250 at (e.g., in or on) the upper substrate 200 (e.g., see FIG. 2), and/or may include the second groove 150 at (e.g., in or on) the lower substrate 100 (e.g., see FIG. 3), to form a cavity having the height of about 10 μm to about 50 μm.

Figure 5:
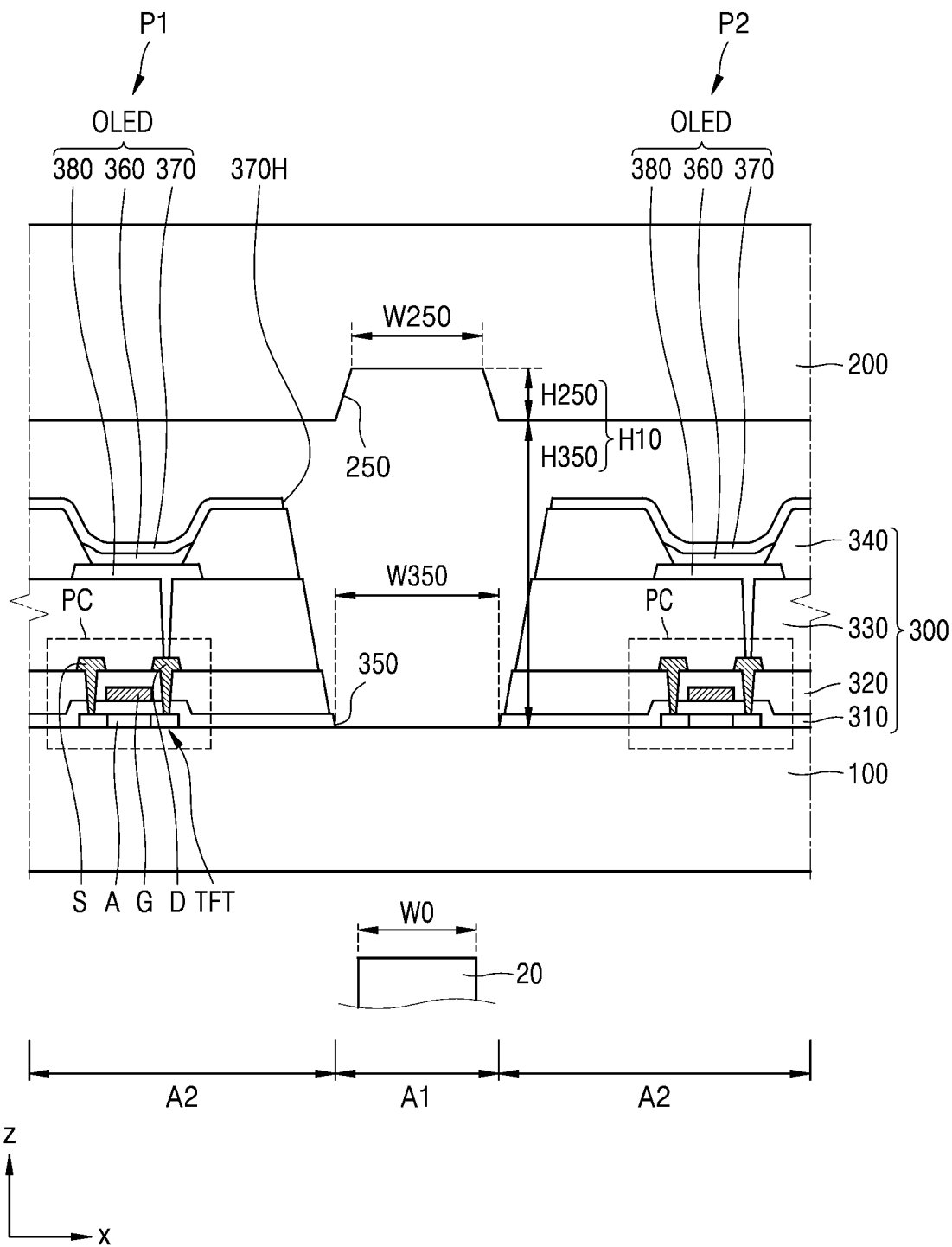
FIG. 5 is a detailed cross-sectional view of a display panel according to an embodiment.

FIG. 5 is a detailed cross-sectional view of the display panel 10 according to an embodiment.

Referring to FIG. 5, the display panel 10 may include the lower substrate 100, the upper substrate 200, and the display layer 300 between the lower substrate 100 and the upper substrate 200.

The display layer 300 may include a plurality of pixels including a first pixel P1 and a second pixel P2. Each of the pixels P1 and P2 may include a pixel circuit PC, and a display element (e.g., an OLED) electrically connected to the pixel circuit PC. Each pixel circuit PC may include a thin-film transistor TFT. The pixels P1 and P2 may be located at (e.g., in or on) the second area A2.

The thin-film transistor TFT may include a semiconductor layer A, a gate electrode G, a source electrode S, and a drain electrode D. The semiconductor layer A may include amorphous silicon, polycrystalline silicon, an organic semiconductor material, and/or the like.

In an embodiment, the semiconductor layer A may include amorphous silicon. In another embodiment, the semiconductor layer A may include an oxide semiconductor including, for example, indium (In), gallium (Ga), stannum (Sn), zirconium (Zr), vanadium (V), hafnium (Hf), cadmium (Cd), germanium (Ge), chromium (Cr), titanium (Ti), and/or zinc (Zn). For example, in an embodiment, the semiconductor layer A may include an oxide semiconductor such as indium gallium zinc oxide (IGZO), zinc tin oxide (ZTO), and/or zinc indium oxide (ZIO).

The gate electrode G may be located above the semiconductor layer A with a gate insulating layer 310 therebetween. The gate electrode G may be formed of a single layer or multi-layers including one or more of molybdenum (Mo), aluminum (Al), copper (Cu), titanium (Ti), and/or the like. For example, in an embodiment, the gate electrode G may have a single layer structure formed of Mo.

The gate insulating layer 310 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The source electrode S and/or the drain electrode D may be located above the gate electrode G with an interlayer insulating layer 320 therebetween. The source electrode S and/or the drain electrode D may be formed of a single layer or multi-layers including one or more of Mo, Al, Cu, Ti, and/or the like. For example, in an embodiment, the source electrode S and/or the drain electrode D may have a multi-layered structure formed of Ti/Al/Ti.

A planarization layer 330 may cover an upper surface of the source electrode S and/or the drain electrode D, and may have a flat or substantially flat (e.g., a planarized) upper surface, such that a pixel electrode 380 may be formed thereon to be flat or substantially flat. The planarization layer 330 may be formed of a single layer or multi-layers including, for example, an organic material. The planarization layer 330 may include a general-purpose polymer, for example, such as benzocyclobutene (BCB), polyimide, hexamethyldisiloxane (HMDSO), polymethylmethacrylate (PMMA), or polystyrene (PS), polymer derivatives having, for example, a phenol-based group, an acryl-based polymer, an imide-based polymer, an aryl ether-based polymer, an amide-based polymer, a fluorine-based polymer, a p-xylene-based polymer, or a vinyl alcohol-based polymer, and/or a combination (e.g., a blend) thereof. The planarization layer 330 may include, for example, an inorganic material. The planarization layer 330 may include $SiO_2$, $SiN_x$, SiON, $Al_2O_3$, $TiO_2$, $Ta_2O_5$, $HfO_2$, or $ZnO_2$. When the planarization layer 330 is formed of an inorganic material, chemical planar polishing may be performed in some cases. The planarization layer 330 may include both an organic material and an inorganic material.

The pixel electrode 380 may include a (semi-)transmissive electrode or a reflective electrode. In some embodiments, the pixel electrode 380 may include a reflective layer formed of, for example, Ag, Mg, Al, Pt, Pd, Au, Ni, Nd, Ir, Cr, or a combination (e.g., a compound) thereof, and may include a transparent or translucent electrode layer formed on the reflective layer. The transparent or translucent electrode layer may include at least one from among indium tin oxide (ITO), indium zinc oxide (IZO), ZnO, indium oxide ($In_2O_3$), indium gallium oxide (IGO), and aluminum zinc oxide (AZO). In some embodiments, the pixel electrode 380 may have a stacked structure of, for example, ITO/Ag/ITO.

A pixel-defining layer 340 may be located on the planarization layer 330. The pixel-defining layer 340 may define an emission area of each pixel by having an opening corresponding to a central portion (e.g., a central area) of the pixel electrode 380. Further, the pixel-defining layer 340 may prevent or substantially prevent arcs and/or the like from being generated at the edges of the pixel electrode 380 by increasing a distance between the edges of the pixel electrode 380 and an opposite electrode 370 on an upper portion of the pixel electrode 380. The pixel-defining layer 340 may include an organic insulating material, for example, such as polyimide, polyamide, acryl resin, BCB, HMDSO, and/or phenol resin, and may be formed by using spin coating and/or the like.

An intermediate layer 360 of the display element OLED may include an organic emission layer. The organic emission layer may include an organic material including, for example, a fluorescent or phosphorous material for emitting red light, green light, blue light, or white light. The organic emission layer may include a low-molecular weight organic material or a high-molecular weight organic material, and functional layers, for example, such as a hole transport layer (HTL), a hole injection layer (HIL), an electron transport layer (ETL), and/or an electron injection layer (EIL), may be selectively arranged on and/or under the organic emission layer. The intermediate layer 360 may be arranged (e.g., may be individually arranged) to correspond to each of a plurality of the pixel electrodes 380. However, the present disclosure is not limited thereto. For example, the intermediate layer 360 may be implemented in various suitable forms including, for example, as an integral layer formed over the plurality of pixel electrodes 380.

The opposite electrode 370 may include a light-transmissive electrode or a reflective electrode. In some embodiments, the opposite electrode 370 may include a transparent or translucent electrode, and may include a metallic thin film having a small work function and including, for example, lithium (Li), calcium (Ca), lithium fluoride (LiF)/Ca, LiF/Al, Al, silver (Ag), magnesium (Mg), and/or a mixture (e.g., a compound) thereof. Further, a transparent conductive oxide (TCO) film, for example, such as ITO, IZO, ZnO, and/or $In_2O_3$, may be further arranged on the metallic thin film. The opposite electrode 370 may be located on an upper portion of the intermediate layer 360 and the pixel-defining layer 340. The opposite electrode 370 may be integrally formed to cover a plurality of display elements OLED, and may include a hole (e.g., an opening) 370H corresponding to the first area A1.

Still referring to FIG. 5, the pixel circuit PC and/or the display element OLED may not be located at (e.g., in or on) the first area A1. First and second pixel circuits PC of adjacent ones of the first pixel P1 and the second pixel P2 that are adjacent to the first area A1 may be spaced apart from each other with respect to the first hole 350 corresponding to the first area A1. Further, first and second display elements OLED of the first pixel P1 and the second pixel P2 may be spaced apart from each other with respect to the first hole 350 corresponding to the first area A1.

The first hole 350 may be formed through a plurality of layers provided at (e.g., in or on) the display layer 300. In an embodiment, the first hole 350 may penetrate a stack of the gate insulating layer 310, the interlayer insulating layer 320, the planarization layer 330, the pixel-defining layer 340, and the opposite electrode 370. For example, the first hole 350 may be formed of holes (e.g., openings) of (e.g., extending through) the gate insulating layer 310, the interlayer insulating layer 320, the planarization layer 330, the pixel-defining layer 340, and the opposite electrode 370, which overlap with each other.

A width W350 (e.g., in the X-axis direction) of the first hole 350 may be defined by a width (e.g., in the X-axis direction) of a hole (e.g., an opening) having a smallest size from among the holes (e.g., the openings) provided in (e.g., extending through) the gate insulating layer 310, the interlayer insulating layer 320, the planarization layer 330, the pixel-defining layer 340, and the opposite electrode 370. In this regard, although FIG. 5 illustrates that a width of the gate insulating layer 310 defines the width W350 of the first hole 350, in another embodiment, the planarization layer 330 may cover side surfaces of the layers thereunder (e.g., the gate insulating layer 310 and the interlayer insulating layer 320), such that the first hole 350 may be defined by a width of a hole (e.g., an opening) provided in the planarization layer 330.

The upper substrate 200 may include the first groove 250 corresponding to the first area A1. A width W250 (e.g., in the X-axis direction) of the first groove 250 may be greater than a width WO (e.g., in the X-axis direction) of the component 20 located under the display panel 10. The width WO of the component 20 may be smaller than each of the width W250 of the first groove 250 and the width W350 of the first hole 350.

The first hole 350 and the first groove 250 may form a cavity between the lower substrate 100 and the upper substrate 200. The height H10 (e.g., in the Z-axis direction) of the cavity may correspond to a sum of a height H350 (e.g., in the Z-axis direction) of the first hole 350 and a depth H250 (e.g., in the Z-axis direction) of the first groove 250. For example, the height H350 of the first hole 350 may be about 5 μm, and the depth H250 of the first groove 250 may be about 5 μm to about 45 μm. In this case, the height H10 of the cavity formed by the first hole 350 and the first groove 250 may be about 10 μm to about 50 μm.

Figure 6:
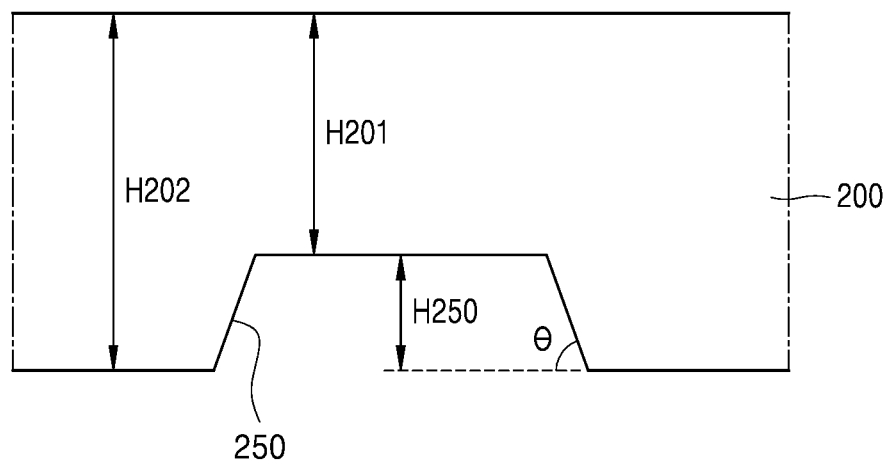
FIG. 6 is a schematic view of an upper substrate according to an embodiment.

FIG. 6 is a schematic view of the upper substrate 200 according to an embodiment. For example, FIG. 6 is an enlarged view of a portion of the upper substrate 200 of FIG. 5 at (e.g., in or on) which the first groove 250 is formed.

As described with reference to FIG. 5, the first groove 250 may be located at (e.g., in or on) a lower surface of the upper substrate 200 to form the cavity together with the first hole 350 of the display layer 300.

Referring to FIG. 6, because the upper substrate 200 includes the first groove 250, a thickness H201 of a portion of the upper substrate 200 where the first groove 250 is formed may be smaller than a thickness H202 of another portion of the upper substrate 200 where the first groove 250 is not formed. For example, the thickness H201 of the portion where the first groove 250 is formed may be smaller than the thickness H202 of the other portion by the depth H250 of the first groove 250. As an example, the thickness H202 of the other portion where the first groove 250 is not formed may be about 150 μm to about 250 μm, and the first groove 250 may have a depth of about 5 μm to about 45 μm.

The first groove 250 may be formed through an etching process. Accordingly, the first groove 250 may include an inclined surface having a taper angle θ of about 5° to about 60°.

FIGS. 7A through 7E illustrate processes of a method of forming a first groove at (e.g., in or on) the upper substrate 200 according to an embodiment.

According to one or more embodiments, a display device may be formed by forming a display layer on an upper surface of a lower substrate, forming a first groove at (e.g., in or on) a lower surface of an upper substrate, and connecting (e.g., attaching or bonding) the upper surface of the lower substrate to the lower surface of the upper substrate. Hereinafter, the method of forming the first groove will be described in more detail with reference to FIGS. 7A through 7E.

Figure 7A:
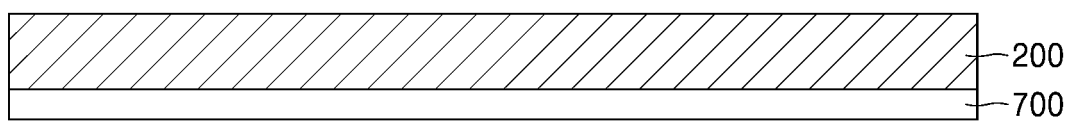
FIGS. 7A-7E illustrate processes of a method of forming a first groove in an upper substrate according to an embodiment.

Referring to FIG. 7A, an acid-resistant film 700 may be attached to one surface of the upper substrate 200 at (e.g., in or on) which the first groove is to be formed, for example, at (e.g., in or on) a lower surface of the upper substrate 200, which faces the lower substrate when connected (e.g., attached or bonded) to each other. In an embodiment, the acid-resistant film 700 may be further attached to an upper surface of the upper substrate 200, as well as to the lower surface of the upper substrate 200. In an embodiment, the acid-resistant film 700 may be attached to the upper substrate 200 by using an acryl-based adhesive.

Figure 7B:
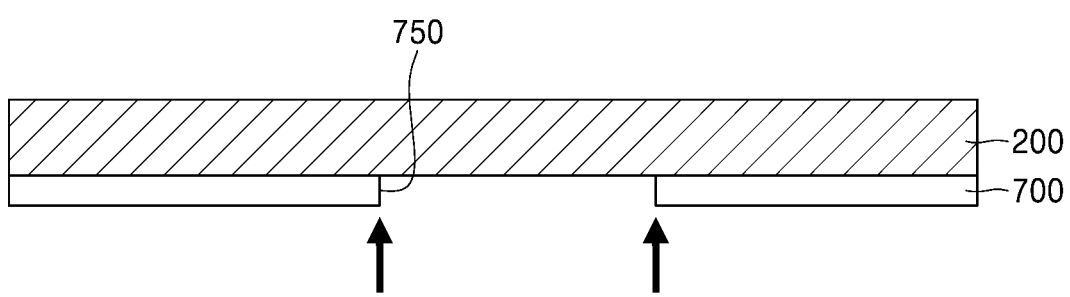

Referring to FIG. 7B, a hole (e.g., an opening) 750 may be formed in the acid-resistant film 700 attached to the lower surface of the upper substrate 200, such that the hole 750 corresponds to a position where the first groove is to be formed. For example, the hole 750 of the acid-resistant film 700 may be formed by cutting the acid-resistant film 700 along a peripheral portion of an area of the upper substrate 200 where the first groove is to be formed, and then removing a portion of the film 700 within (e.g., inside) the cut portion. The position where the first groove is to be formed may correspond to the first area A1 (e.g., as shown in FIG. 2).

Figure 7C:
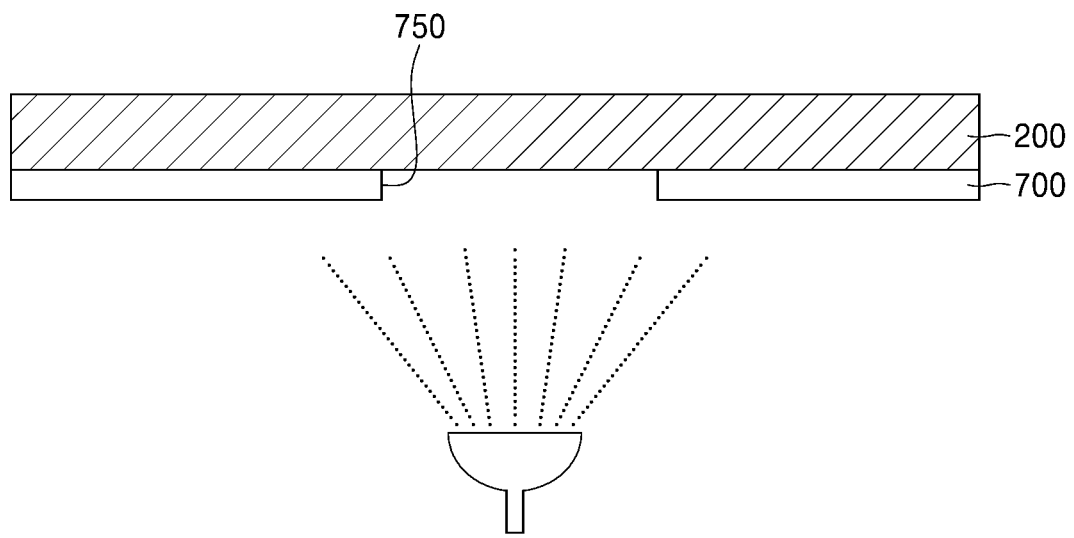

Referring to FIG. 7C, an etching process may be performed by applying an etchant to the upper substrate 200 to which the acid-resistant film 700 is attached.

The etchant may be a material capable of etching, for example, a glass material containing $SiO_2$ as a main component, and in this case, may include at least one from among sulfuric acid ($H_2SO_4$), hydrofluoric acid (HF), and hydrochloric acid (HCl).

Figure 7D:
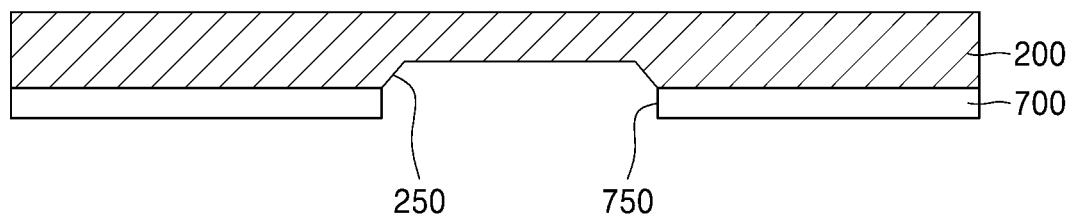

According to the etching process, as shown in FIG. 7D, the first groove 250 corresponding to an area of the hole 750 of the acid-resistant film 700 may be formed at (e.g., in or on) the upper substrate 200.

The acid-resistant film 700 may be formed of a material that does not react to the etchant, and thus, may protect or substantially protect portions of the upper substrate 200 where the first groove 250 is not formed (e.g., portions other than the portion where the first groove 250 is formed) from being etched.

Figure 7E:
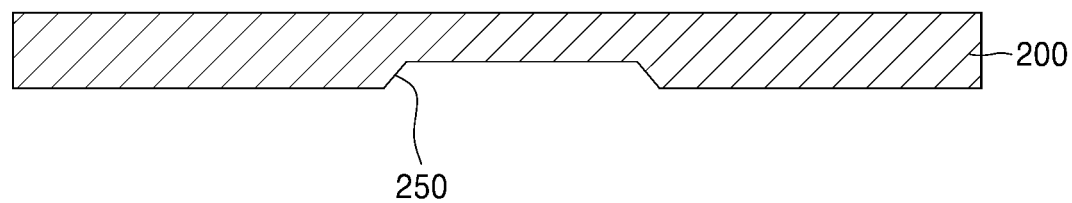

Referring to FIG. 7E, remaining portions of (e.g., an entirety of or all of) the acid-resistant film 700 that is attached to the upper substrate 200 may be removed to form (e.g., to obtain) the upper substrate 200 in which the first groove 250 is formed.

The first groove 250 formed according to the above-described method may be etched to have a taper angle of about 5° to about 60°, and a depth of about 5 μm to about 45 μm.

Similarly, the second groove 150 (e.g., see FIG. 3) may be formed at (e.g., in or on) the lower substrate 100 using the same or substantially the same method shown in FIGS. 7A through 7E. In this case, in an embodiment, the second groove 150 (e.g., see FIG. 3) may be formed before forming the display layer 300 on the lower substrate 100, but the present disclosure is not limited thereto.

After the first groove 250 is formed at (e.g., in or on) the lower surface of the upper substrate 200, the input sensing layer 40 (e.g., see FIG. 2) may be formed on the upper surface of the upper substrate 200. As shown in FIG. 2, the input sensing layer 40 may include the second hole 45 corresponding to the first area A1.

According to one or more embodiments, a display device having improved optical characteristics without deteriorating (e.g., without reducing or substantially reducing) functions of a component, and a method of manufacturing the same, may be provided.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
a lower substrate comprising a first area, and a second area surrounding the first area;
a display layer comprising a plurality of display elements at the second area, and having a first hole corresponding to the first area; and
an upper substrate covering the display layer,
wherein the upper substrate comprises a lower surface facing the lower substrate, and the lower surface of the upper substrate has a first groove corresponding to the first area.

2. The display device of claim 1, wherein
a space is defined by the first hole and the first groove at the first area between the lower substrate and the upper substrate, and has a height of about 10 μm to about 50 μm.

3. The display device of claim 1, wherein
a taper angle at one end of the first groove is about 5° to about 60°.

4. The display device of claim 1, wherein
a depth of the first groove is about 5 μm to about 45 μm.

5. The display device of claim 1, wherein
the plurality of display elements comprises a first display element and a second display element that are adjacent to each other, and the first display element and the second display element are spaced from each other with respect to the first hole.

6. The display device of claim 1, wherein
each of the plurality of display elements comprises a pixel electrode, an opposite electrode, and an intermediate layer between the pixel electrode and the opposite electrode, and the opposite electrode is integrally provided as a single body and has a hole corresponding to the first area.

7. The display device of claim 1, further comprising an input sensing layer on the upper substrate and having a second hole corresponding to the first area.

8. The display device of claim 1, wherein the lower substrate comprises an upper surface facing the upper substrate, and the upper surface of the lower substrate has a second groove corresponding to the first area.

9. The display device of claim 8, wherein
the second groove is formed through an etching process before forming the display layer.

10. The display device of claim 8, wherein
a space is defined by the first groove, the first hole, and the second groove at the first area between the lower substrate and the upper substrate, and has a height of about 10 μm to about 50 μm.

11. The display device of claim 1, wherein
each of the lower substrate and the upper substrate comprises a glass material comprising at least one from among silicon oxide ($SiO_2$), magnesium oxide (MgO), calcium oxide (CaO), and zinc oxide (ZnO).

12. A method of manufacturing a display device comprising a first area and a second area surrounding the first area, the method comprising:
forming a groove corresponding to the first area at at least one of a lower substrate and an upper substrate;
forming a display layer on the lower substrate, the display layer comprising a plurality of display elements corresponding to the second area, and having a first hole corresponding to the first area;
arranging the upper substrate on the lower substrate with the display layer therebetween; and
bonding an upper surface of the lower substrate to a lower surface of the upper substrate by using a sealant.

13. The method of claim 12, wherein the forming of the groove comprises:
attaching an acid-resistant film to the lower surface of the upper substrate;
removing a portion of the acid-resistant film corresponding to the first area and attached to the upper substrate;
etching, the upper substrate to which the acid-resistant film is attached by using an etchant; and
removing remaining portions of the acid-resistant film attached to the upper substrate.

14. The method of claim 13, wherein
the etchant comprises at least one from among sulfuric acid ($H_2SO_4$), hydrofluoric acid (HF), and hydrochloric acid (HCl).

15. The method of claim 12, wherein
the forming of the groove comprises forming the groove to have a taper angle of about 5° to about 60°.

16. The method of claim 12, wherein
the forming of the groove comprises forming the groove to have a depth of about 5 μm to about 45 μm.

17. The method of claim 12, wherein
the groove and the first hole overlap with each other to form a space having a height of about 10 μm to about 50 μm.

18. The method of claim 12, wherein
the sealant is between the lower substrate and the upper substrate, and surrounds the plurality of display elements.

19. A display device comprising:
a substrate comprising a first area, and a second area surrounding the first area; and
an input sensing layer on a first surface of the substrate, and having a hole corresponding to the first area,
wherein the substrate has a groove corresponding to the first area at a second surface opposite the first surface.

20. The display device of claim 19, wherein
the groove has a depth of about 5 μm to about 45 μm.

* * * * *